(12) United States Patent
Huang

(10) Patent No.: US 11,966,129 B2
(45) Date of Patent: Apr. 23, 2024

(54) DISPLAY PANEL STATIC ELECTRICITY PROTECTION DEVICE, DISPLAY PANEL STATIC ELECTRICITY PROTECTION METHOD, AND DISPLAY DEVICE

(71) Applicant: HKC CORPORATION LIMITED, Shenzhen (CN)

(72) Inventor: Xiaoyu Huang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 438 days.

(21) Appl. No.: 17/288,537

(22) PCT Filed: Mar. 6, 2020

(86) PCT No.: PCT/CN2020/078175
§ 371 (c)(1),
(2) Date: Apr. 25, 2021

(87) PCT Pub. No.: WO2020/182072
PCT Pub. Date: Sep. 17, 2020

(65) Prior Publication Data
US 2021/0389633 A1    Dec. 16, 2021

(30) Foreign Application Priority Data
Mar. 13, 2019 (CN) .......... 201910187912.7

(51) Int. Cl.
*G02F 1/1362* (2006.01)
*G02F 1/1368* (2006.01)
*G02F 1/133* (2006.01)

(52) U.S. Cl.
CPC ........ *G02F 1/136204* (2013.01); *G02F 1/133* (2013.01); *G02F 1/1368* (2013.01)

(58) Field of Classification Search
CPC ...... G02F 1/133; G02F 1/1333; G02F 1/1362; G02F 1/136204; G02F 1/1368; G09G 3/00; H01L 23/60; H02H 9/00
See application file for complete search history.

(56) References Cited

U.S. PATENT DOCUMENTS 7,102,862 B1   9/2006  Lien et al.
2003/0137789 A1  7/2003  Randazzo et al.
(Continued)

FOREIGN PATENT DOCUMENTS

CN   101442046 A   5/2009
CN   101483339 A   7/2009
(Continued)

OTHER PUBLICATIONS

Patent Translate CN 108172572 (Jun. 15, 2018).*
(Continued)

*Primary Examiner* — Thoi V Duong

(57) ABSTRACT

The present disclosure provides a display panel static electricity protection device (400), a display panel static electricity protection method, and a display device (100), including a detection circuit (401), a discharge circuit (409), and a discharge terminal (411). The detection circuit (401) is connected with a driving chip (301) of a display panel. The discharge circuit (409) is connected with the detection circuit (401) and the driving chip (301). The discharge terminal (411) is connected with the discharge circuit (409) and the detection circuit (401).

13 Claims, 3 Drawing Sheets

(56) References Cited

U.S. PATENT DOCUMENTS

| | | | |
|---|---|---|---|
| 2010/0007596 A1* | 1/2010 | Cho | G09G 3/20 345/98 |
| 2011/0304940 A1 | 12/2011 | Cao et al. | |
| 2012/0257317 A1 | 10/2012 | Abou-Khalil et al. | |
| 2019/0157231 A1* | 5/2019 | Oh | H01L 24/16 |

FOREIGN PATENT DOCUMENTS

| | | | |
|---|---|---|---|
| CN | 101517671 A | 8/2009 | |
| CN | 101533830 A | 9/2009 | |
| CN | 104241269 A | 12/2014 | |
| CN | 106505066 A | 3/2017 | |
| CN | 108172572 A | 6/2018 | |
| CN | 109285510 A | 1/2019 | |
| CN | 109817133 A | 5/2019 | |
| CN | 109950885 A | 6/2019 | |

OTHER PUBLICATIONS

Patent Translate CN 104241269 (Dec. 24, 2014).*
Shaowei Wang, the International Searching Authority written comments, dated Jun. 2020, CN.
Shaowei Wang, the International Searching Report dated Jun. 2020, CN.

* cited by examiner

DISPLAY PANEL STATIC ELECTRICITY PROTECTION DEVICE, DISPLAY PANEL STATIC ELECTRICITY PROTECTION METHOD, AND DISPLAY DEVICE

CROSS REFERENCE OF RELATED APPLICATIONS

This application claims priority to the Chinese Patent Application No. CN 201910187912.7, filed with National Intellectual Property Administration, PRC on Mar. 13, 2019 and entitled "DISPLAY PANEL STATIC ELECTRICITY PROTECTION DEVICE, DISPLAY PANEL STATIC ELECTRICITY PROTECTION METHOD, AND DISPLAY DEVICE", which is incorporated herein by reference in its entirety.

TECHNICAL FIELD

The present disclosure relates to a field of display technology, and in particular to a display panel static electricity protection device, a display panel static electricity protection method, and a display device.

BACKGROUND

Statements herein merely provide background information related to the present disclosure and do not necessarily constitute prior art.

Display panels are one of main varieties of present flat panel displays, and have become an important display platform in modern video products. Main driving principle of the display panels are as follows: a system mainboard connects red (R), green (G), blue (B) compressed signals, control signals, and power with electronic connectors on a printed circuit board through wires, data processed by a driving chip on the printed circuit board, passing through the printed circuit board, is connected with a display area through Source-Chip on Film (S-COF) and Gate-Chip on Film (G-COF), so that a liquid crystal display obtains required power and signals.

Static electricity protection device on the printed circuit board can be burnt due to continuous static electricity discharge of energy and cannot continue to perform static electricity discharge protection.

SUMMARY

In view of above, the present disclosure provides a display panel static electricity protection device, a display panel static electricity protection method, and a display device.

To achieve above objects, the present disclosure provides a display panel static electricity protection device, including a detection circuit, a discharge circuit, and a discharge terminal. The detection circuit is connected with a driving chip of a display panel. The discharge circuit is connected with the detection circuit and the driving chip. The discharge terminal is connected with the discharge circuit and the detection circuit. After the detection circuit detects static electricity, the detection circuit opens the discharge circuit, and the static electricity is discharged to the discharge terminal through the discharge circuit.

The present disclosure further provides a display panel static electricity protection method, including a display panel. The display panel includes a detection circuit connected with a driving chip of a display panel, a discharge circuit connected with the detection circuit and the driving chip, and a discharge terminal connected with the discharge circuit and the detection circuit. The display panel static electricity protection method includes steps:

detecting whether the driving chip has static electricity by the detection circuit;

opening the discharge circuit if the driving chip has the static electricity; and closing the discharge circuit if the driving chip has none of the static electricity.

The present disclosure further provides a display device, including a display panel, a driving circuit board, and a static electricity protection device. The static electricity protection device includes a detection circuit connected with a driving chip of a display panel, a discharge circuit connected with the detection circuit and the driving chip, and a discharge terminal connected with the discharge circuit and the detection circuit. After the detection circuit detects static electricity, the detection circuit opens the discharge circuit, and the static electricity is discharged to the discharge terminal through the discharge circuit. The driving circuit board is connected with the display panel. The static electricity protection device is disposed on the driving circuit board As opposed to a reverse diode only scheme, the present disclosure separates the detection circuit of the static electricity with the discharge circuit of the static electricity. When a certain static electricity is generated at an output terminal of the driving chip, the detection circuit detects the static electricity from the output terminal of the driving chip, at this time, the detection circuit reacts to open the discharge circuit, so that the driving chip, the discharge circuit, and the discharge terminal are temporarily conducted, the static electricity is discharged from the driving chip to the discharge terminal through the discharge circuit. After static electricity is completely discharged, the detection circuit reacts to close the discharge circuit, so that the driving chip and the discharge terminal are disconnected. Overload capacity of the discharge circuit is greater than that of the reverse diode, thus, even though high-energy or continuous electronic static discharge happens, the display panel static electricity protection device does not be damaged, which improves protection performance and reliability of the static electricity protection device.

BRIEF DESCRIPTION OF DRAWINGS

The drawings are included to provide a further understanding of embodiments of the present disclosure, which form portions of the specification and are used to illustrate implementation manners of the present disclosure and are intended to illustrate operating principles of the present disclosure together with the description. Apparently, the drawings in the following description are merely some of the embodiments of the present disclosure, and those skilled in the art are able to obtain other drawings according to the drawings without contributing any inventive labor. In the drawing.

DETAILED DESCRIPTION

Figure 1:
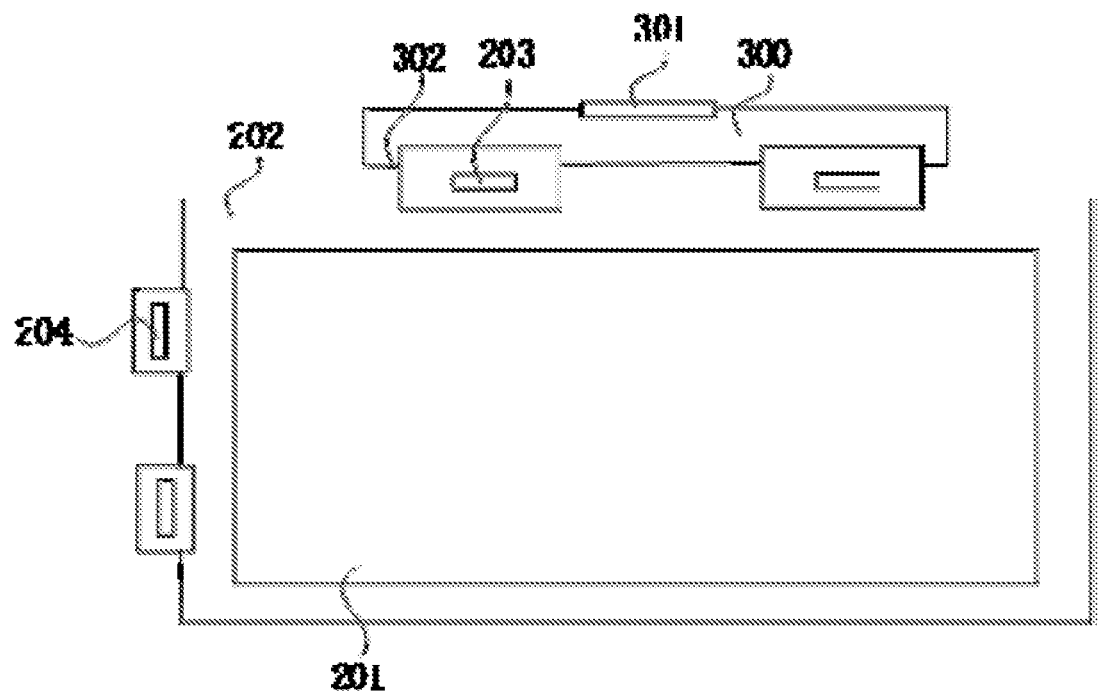
FIG. 1 is a schematic diagram of an exemplary display device according of the present disclosure.

Specific structure and function details disclosed herein are only representative and are used for the purpose of describing exemplary embodiments of the present disclosure. However, the present disclosure may be achieved in many alternative forms and shall not be interpreted to be only limited to the embodiments described herein.

It should be understood in the description of the present disclosure that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure. In addition, the terms such as "first" and "second" are only used for the purpose of description, rather than being understood to indicate or imply relative importance or hint the number of indicated technical features. Thus, the features limited by "first" and "second" can explicitly or implicitly include one or more features. In the description of the present disclosure, the meaning of "a plurality of" is two or more unless otherwise specified. In addition, the term "include" and any variant are intended to cover non-exclusive inclusion.

It should be noted in the description of the present disclosure that, unless otherwise regulated and defined, terms such as "installation", "bonded", and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two elements. For those of ordinary skill in the art, the meanings of the above terms in the present disclosure may be understood according to concrete conditions.

The terms used herein are intended to merely describe concrete embodiments, not to limit the exemplary embodiments. Unless otherwise noted clearly in the context, singular forms "one" and "single" used herein are also intended to include plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

In the drawings, similar structures are indicated by same labels.

As shown in FIG. 1, Thin Film Transistor Liquid Crystal Display (TFT-LCD) is one of main varieties of present flat panel display, and becomes an important display platform in modern Information Technology (IT) and video products. Main driving principle of the TFT-LCD are as follows: a system mainboard connects red (R), green (G), blue (B) compressed signals, control signals, and power with electronic connectors 302 on a Printed Circuit Board (PCB) 300 through wires, data processed by a timing controller (TCON) and an integrated circuit (IC) on the printed circuit board, passing through the printed circuit board, is connected with a display area 201 through Source-Chip on Film (S-COF) 203 and Gate-Chip on Film (G-COF) 204, so that liquid crystal display (LCD) obtains required power and signals.

Figure 2:
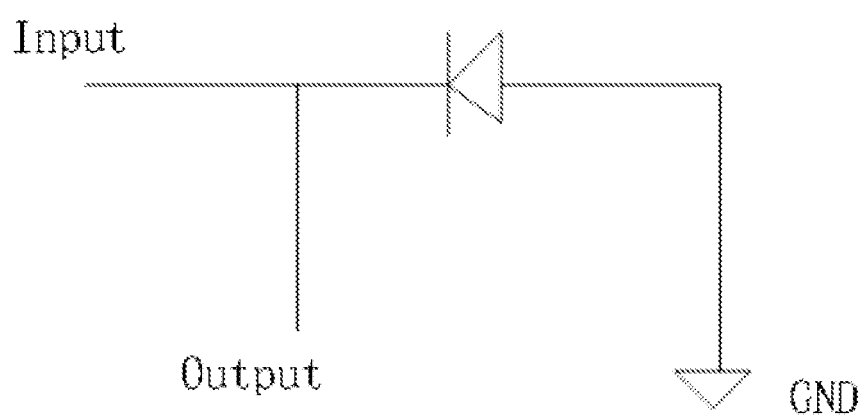
FIG. 2 is a schematic diagram of an exemplary reverse diode static electricity protection device of the present disclosure.

As users' requirements for product reliability continue to improve, and requirements for product quality continue to be stringent, protection level and reliability requirements of electronic static discharge (ESD) are increasingly high. As shown in FIG. 2, a method of ESD protection is achieved by a reverse diode. When high-energy or continuous electronic static discharge happens, the reverse diode is damaged, so that ESD protection cannot continue.

The present disclosure is further described below with reference to the accompanying drawings and optional embodiments.

Figure 3:
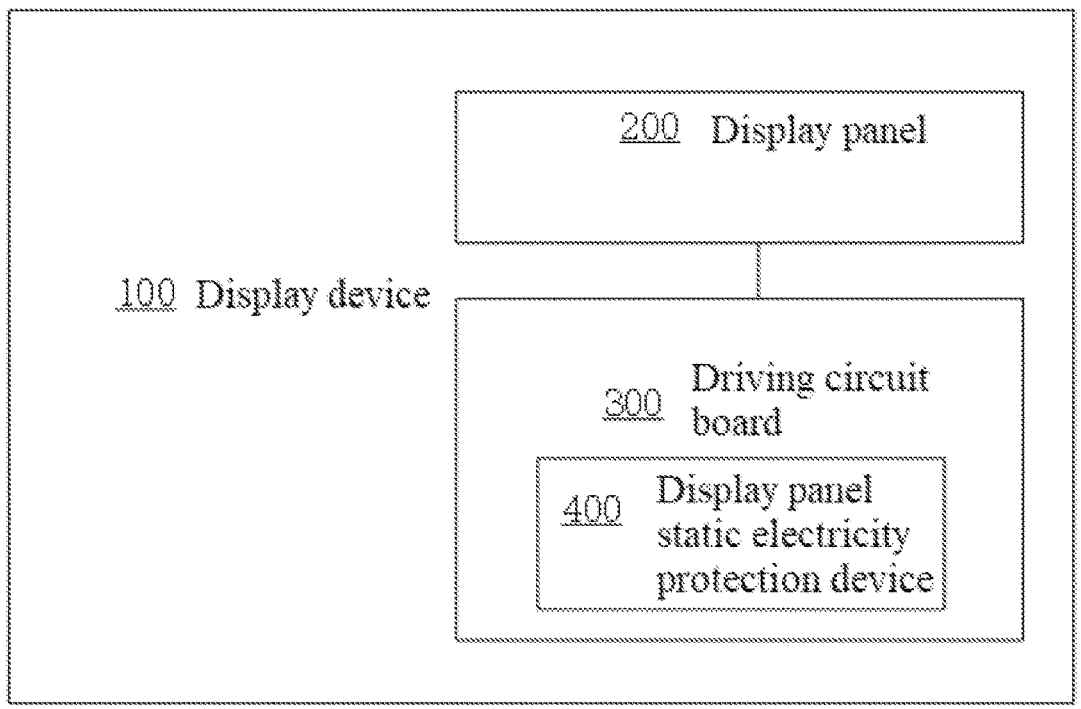
FIG. 3 is a schematic diagram of a display device according to one embodiment of the present disclosure.

As shown in FIG. 3, the present disclosure provides a display device 100, including a display panel 200, a driving circuit hoard 300, and a static electricity protection device of the display panel 200 shown below.

The display panel 200 includes a display area, a non-display area, a source electrode thin film driving chip, and a gate electrode thin film driving chip. The driving circuit board includes a driving chip and a connector. The driving circuit board is connected with the display panel 200, the non-display area surrounds the display area, the display area is configured to display pictures, the non-display area is connected with the source electrode thin film driving chip and the gate electrode thin film driving chip, the source electrode thin film driving chip is connected with the connector, the connector is connected with the driving chip. Signals and power within the driving circuit board 300 are transmitted to the display area through the connector, the source electrode thin film driving chip, the gate electrode thin film driving chip, and some wires.

Figure 4:
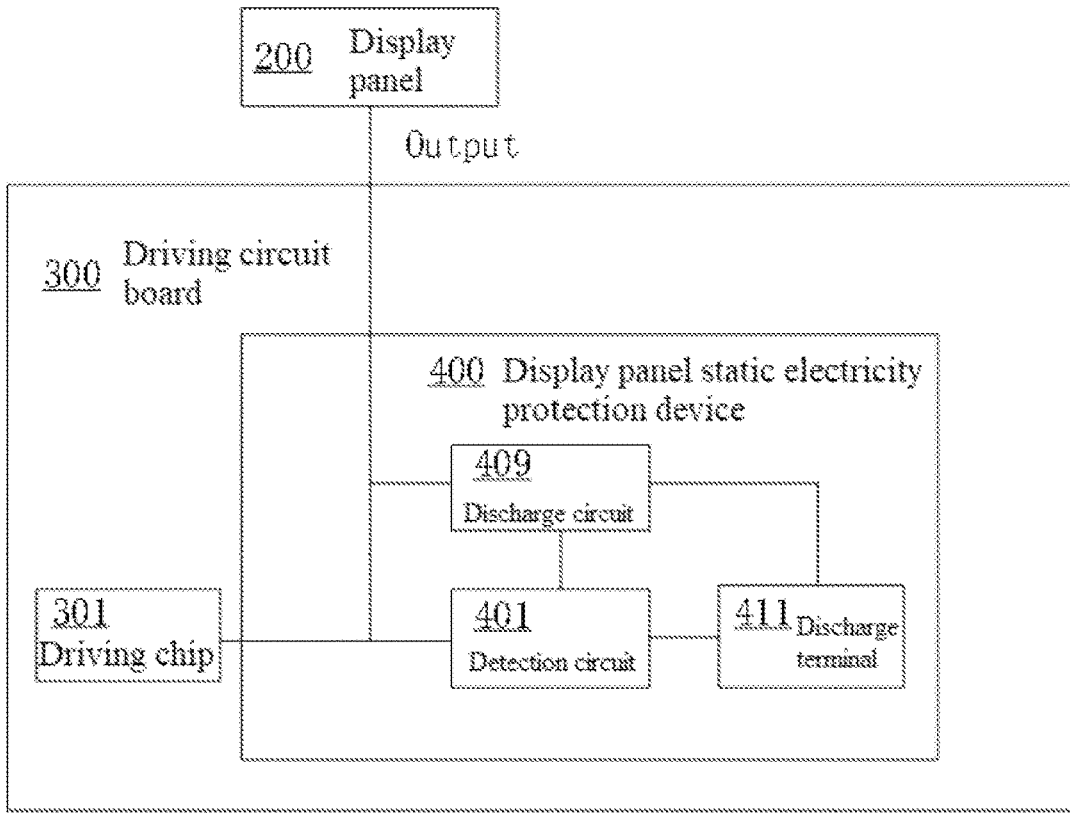
FIG. 4 is a schematic diagram of a detection circuit and a discharge circuit according to one embodiment of the present disclosure.

As shown in FIG. 4, the present disclosure provides a display panel static electricity protection device 400, including a detection circuit 401, a discharge circuit 409, and a discharge terminal 411. The detection circuit 401 is connected with a driving chip 301, the discharge circuit 409 is connected with the detection circuit 401 and the driving chip 301, the discharge terminal 411 is connected with the discharge circuit 409 and the detection circuit 401. A static electricity protection method of the display panel is shown as below. The driving chip 301 is normally connected with the connector, when a certain static electricity is generated at an output terminal of the driving chip 301, the detection circuit 401 detects the static electricity from the output terminal of the driving chip 301, at this time, the detection circuit 401 reacts to open the discharge circuit 409, so that the driving chip 301, the discharge circuit 409, and the discharge terminal 411 are temporarily conducted, the static electricity is discharged from the driving chip 301 to the discharge terminal 411 through the discharge circuit 409. After static electricity is completely discharged, the detection circuit 401 reacts to close the discharge circuit 409, so that the driving chip 301 and the discharge terminal 411 are disconnected, thus, even though high-energy or continuous electronic static discharge happens, the display panel static electricity protection device does not be damaged, which improves protection performance and reliability of the static electricity protection device. The discharge terminal 411 is normally connected with a grounding wire.

In one embodiment, the driving chip 301 is a timing controller chip or a power chip. The timing controller chip transmits data signals to the display panel through the connector, the power chip transmits power to the display panel through the connector. During a transmission process, the high-energy or continuous static electricity may be generated, so that the static electricity protection device needs to be disposed. The static electricity protection device is connected with the timing controller chip and the connector, and the static electricity protection device is further connected with the power chip and the connector.

Figure 5:
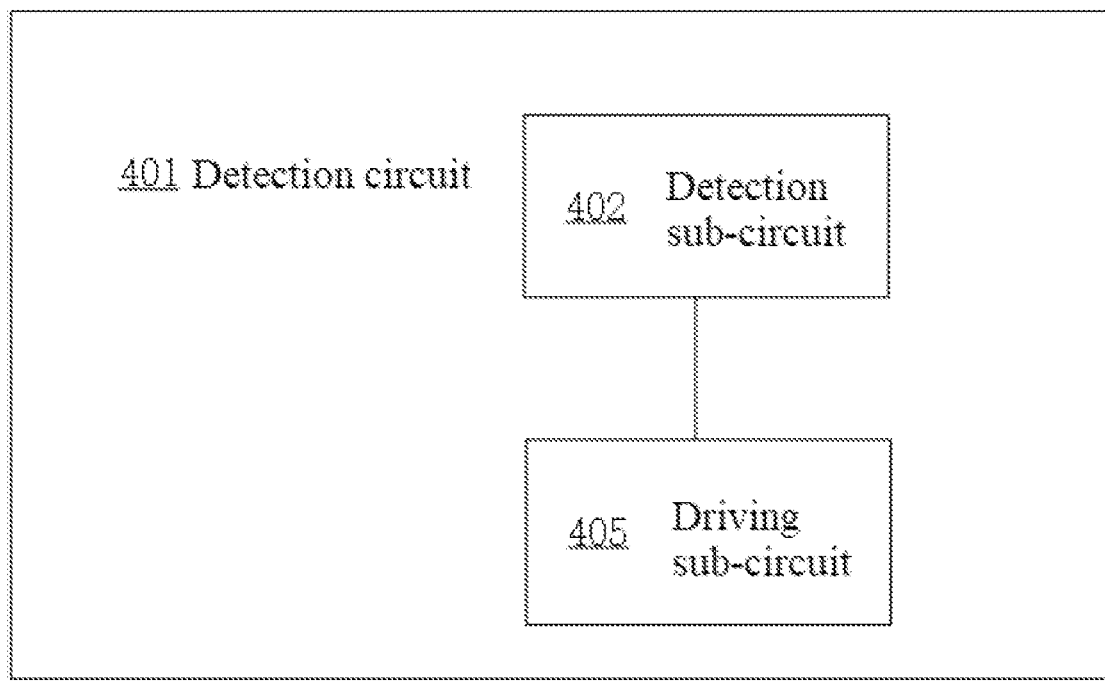
FIG. 5 is a schematic diagram of a detection sub-circuit and a driving sub-circuit according to one embodiment of the present disclosure.

As shown in FIG. 5, the detection circuit 401 includes a detection sub-circuit 402 and a driving sub-circuit 405, the detection sub-circuit 402 is connected with the driving sub-circuit 405. When the static electricity passes through the detection sub-circuit 402, the driving sub-circuit opens the discharge circuit to discharge the static electricity to the discharge terminal.

The detection sub-circuit 402 may stop electrostatic current within a set voltage, when a voltage is greater than the set voltage of the detection sub-circuit 402, one portion of the electrostatic current flows through the detection sub-circuit 402, thereby triggering the driving sub-circuit 405 to open the discharge circuit 409, and other portion of the electrostatic current is discharged to the discharge terminal 411 through the discharge circuit 409.

Figure 6:
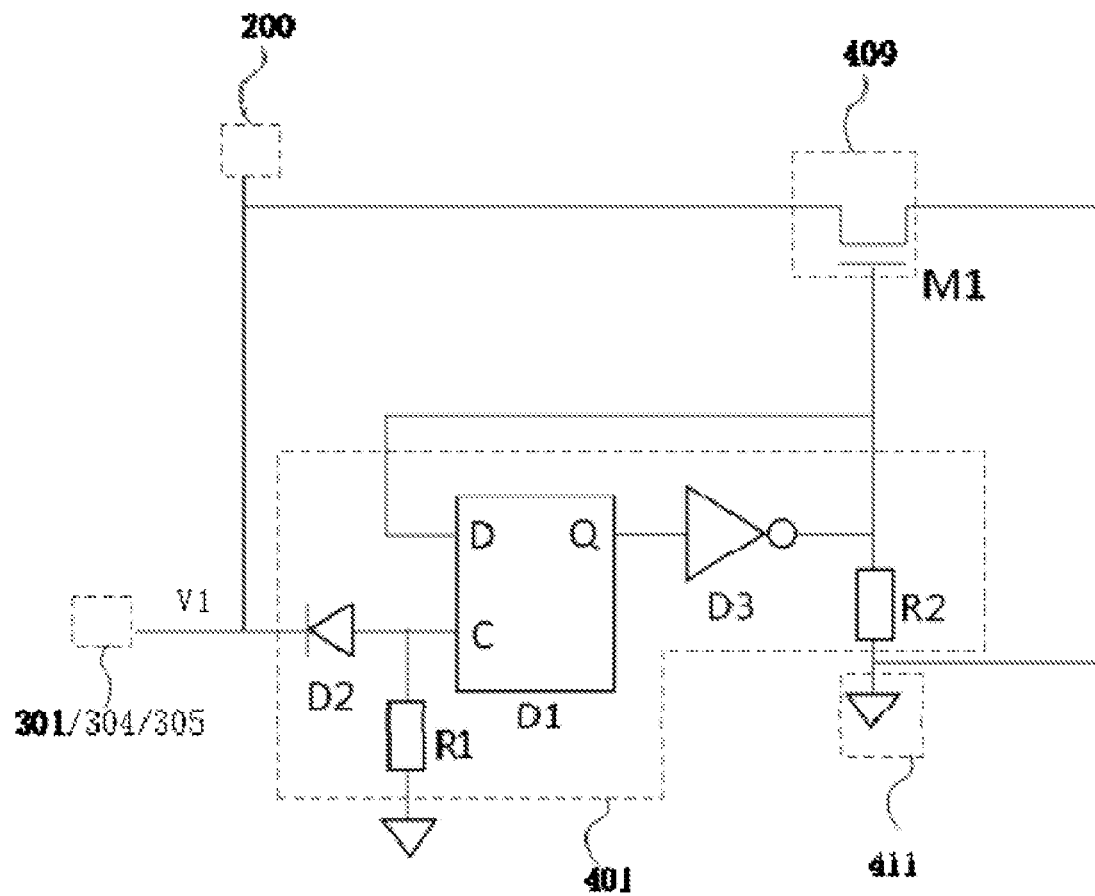
FIG. 6 is a schematic diagram of a static electricity protection device according to one embodiment of the present disclosure.

Specifically, as shown in FIG. 6, the detection sub-circuit 402 includes a reverse diode D2, a cathode of the reverse diode D2 is connected with the driving chip, an anode of the reverse diode D2 is connected with the driving sub-circuit. A breakdown voltage value of the reverse diode D2 is greater than a maximum operating voltage of the driving chip. In order to ensure that the reverse diode D2 does not conduct in absence of static electricity to trigger the driving sub-circuit, the breakdown voltage value of the reverse diode D2 is from 1.05 to 1.2 times the maximum operating voltage value of the driving chip.

Using the breakdown voltage value of the reverse diode D2 as a threshold voltage for static electricity determination does not affect normal operation of circuits under normal conditions. When static electricity is too high or continuous, the reverse diode D2 is temporarily conducted to trigger the discharge circuit to discharge, moreover, the reverse diode D2 discharges a certain amount of the static electricity, partly undertakes the static electricity discharging for conduction to be a trigger signal to trigger the driving sub-circuit to open the discharge circuit. After the static electricity is discharged, the reverse diode D2 continues to be used to prevent the high-energy and continuous static electricity next time. Certainly, the detection sub-circuit may also use voltage sensors, etc., the same can achieve a function of static electricity detection.

In one embodiment, the discharge circuit includes a semiconductor field effect transistor M1. An input terminal of the semiconductor filed effect transistor M1 is connected with the driving chip, a control terminal of the semiconductor filed effect transistor M1 is connected with the detection circuit, and an output terminal of the semiconductor field effect transistor M1 is connected with the grounding wire.

The semiconductor filed effect transistor M1 has a role of a switch, overload capacity of the semiconductor filed effect transistor M1 is greater than the reverse diode D2, and the semiconductor filed effect transistor M1 can be triggered by the driving sub-circuit to turn on or off, the semiconductor filed effect transistor M1 turns on when the static electricity needs to be discharged and turns off when the static electricity has no need to be discharged.

The semiconductor filed effect transistor M1 is a N-type Metal Oxide Semicon-Ductor (MOS) transistor, the N-type MOS transistor turns on when a control terminal signal is high and turns off when the control signal is low, and the N-type MOS transistor is not easily damaged when passing high currents, thereby ensuring stability of the static electricity protection device.

The driving sub-circuit includes an edge trigger D1 and a reverse device D3. A C terminal of the edge trigger D1 is connected with the detection sub-circuit, a D terminal of the edge trigger D1 is connected with the discharge circuit, a Q terminal of the edge trigger D1 is connected with an input terminal of the reverse device D3, and an output terminal of the reverse device D3 is connected with the discharge circuit. In order to improve the overload capability, multiple N-type MOS transistors may be connected in parallel as needed.

When the reverse diode D2 is broken down to pass through partial current, the edge trigger D1 receives a rising edge of a signal, the Q terminal of the edge trigger D1 outputs a low level, the low level passes the reverse device D3, the reverse device D3 has a configuration of reversely outputting a level signal of an input terminal, thus, the low level passes through the output terminal of reverse device D3 then becoming a high level. The control terminal signal of the N-type MOS transistor is H, when the N-type MOS transistor is turned on, external static electricity energy is discharged to the discharge terminal 411 through the N-Type MOS transistor. The discharge terminal includes the grounding wire, the static electricity is discharged by the grounding wire to avoid damage to other elements of the driving circuit board 300.

The detection sub-circuit 402 includes a first resistor R1, the first resistor R1 is connected with the anode of the reverse diode D2, the first resistor R1 is connected with the C terminal of the edge trigger D1, the first resistor R1 is further connected with the grounding wire. The first resistor R1 is a grounding resistor, the grounding resistor gives an initial level to the driving sub-circuit 405, a resistance value of the first resistor R1 is large, generally above 100 kΩ, so that static electricity current passing through the first resistor R1 is small. The edge trigger D1 is triggered by an edge to detect the voltage, and is further triggered by the voltage, so that a reaction speed of static electricity is faster.

The driving sub-circuit 405 includes a second resistor R2. The second resistor R2 is connected with the output terminal of the reverse device D3, the second resistor R2 is connected with a control terminal of N-Type MOS transistor, the second resistor R2 is further connected with the grounding wire.

As shown in FIG. 6, in one embodiment, the present disclosure provides a static electricity protection device of display panel 200, including a detection circuit 401, a discharge circuit 409, and a discharge terminal 411, the detection circuit 401 is connected with the driving chip of display panel 200. The discharge circuit 409 is connected with the detection circuit 4001 and the driving chip 301. The discharge terminal 411 is connected with the discharge circuit 409 and the detection circuit 401, the discharge terminal 411 is further connected with the grounding wire.

The driving chip 301 includes a timing controller chip and a power chip 305, the detection circuit 401 includes a detection sub-circuit 402 and a driving sub-circuit 405, the detection sub-circuit 402 includes a reverse diode D2 and a first resistor R1, the driving sub-circuit 405 includes an edge trigger D1, a reverse device D3, and a second resistor R2, the discharge circuit 409 includes a N-type MOS transistor, an input terminal of the N-type MOS transistor is connected with the timing controller chip or the power chip 305, a control terminal of the N-type MOS transistor is connected with the driving sub-circuit 405, an output terminal of the N-type MOS transistor is connected with the grounding wire, a C terminal of the edge trigger D1 is connected with an anode of the reverse diode D2, a D terminal of the edge trigger D1 is connected with a control terminal of the N-type MOS transistor, a Q terminal of the edge trigger D1 is connected with an input terminal of the reverse device D3, an output terminal of the reverse device D3 is connected with the control terminal of the N-type MOS transistor, a cathode of the reverse diode D2 is connected with the timing controller chip or the power chip 305. The first resistor R1 is connected with the anode of the reverse diode D2, the first resistor R1 is connected with the C terminal of the edge trigger D1, the first resistor R1 is further connected with the grounding wire. The second resistor R2 is connected with the output terminal of the reverse device D3, the second resistor R2 is connected with the control terminal of the N-type MOS transistor, the second resistor R2 is further connected with the grounding wire. The first resistor R1 and the second resistor R2 belong to grounding resistors, and give the circuit an initial level.

When the timing controller chip or the power chip 305 generate high-energy static electricity, the reverse diode D2 is broken down to pass through partial current, the edge trigger D1 receives a rising edge of a signal, the Q terminal of the edge trigger D1 outputs a low level, the low level passes through the reverse device D3, the reverse device D3 has a configuration of reversely outputting a level signal of an input terminal, thus, the low level passes through the output terminal of reverse device D3 then becoming a high level. The control terminal signal of the N-type MOS transistor is the high level, so that the N-type MOS transistor is turned on, external static electricity energy is discharged to the discharge terminal 411 and the grounding wire through the input terminal and the output terminal of the N-Type MOS transistor. When the high-energy static electricity is discharged, the reverse diode D2 turns back to an off state and no longer passes the static electricity. At this time, the edge trigger D1 receives a falling edge of the signal, the Q terminal of the edge trigger D1 outputs a high level, the high level passes through the reverse device D3 then becoming a low level, at this time, the control terminal signal of the N-type MOS transistor is the low level, so that the N-type MOS transistor is turned off, the static electricity device turns back to an initial state. A principle of waiting for next high-energy static electricity generation is same as above, a main application scope of the static electricity protection device of the present scheme is for electrostatic discharge of high voltage and low current, and since the edge trigger D1 detects the rising edge of the voltage when the high-energy static electricity is generated, a detection reaction speed is fast, which discharges the static electricity with high efficiency.

The technical solutions of the present disclosure are able to be widely used in various display panels, such as Twisted Nematic (TN) display panels, In-Plane Switching (IPS) display panels, Vertical Alignment (VA) display panels, display panels, and Multi-Domain Vertical Alignment (MVA) display panels. Certainly, the present disclosure are able to be widely used in other types of display panels, such as Organic Light-Emitting Diode (OLED) display panels, which is also able to be applies to the above embodiments The above content is a further detailed description of the present disclosure in conjunction with the specific preferred embodiments, and the specific implementation of the present disclosure is not limited to the description. It will be apparent to those skilled in the art that a number of simple deductions or substitutions may be made without departing from the conception of the present disclosure, which should be considered as being within the scope of the present disclosure.

What is claimed is:

1. A display panel static electricity protection device, comprising:
    a detection circuit connected with a driving chip of a display panel;
    a discharge circuit connected with the detection circuit and the driving chip; and
    a discharge terminal connected with the discharge circuit and the detection circuit;
    wherein after the detection circuit detects static electricity, the detection circuit opens the discharge circuit, and the static electricity is discharged to the discharge terminal through the discharge circuit;
    wherein the detection circuit comprises a detection sub-circuit and a driving sub-circuit; the detection sub-circuit is connected with the driving sub-circuit; when the static electricity passes through the detection sub-circuit, the driving sub-circuit opens the discharge circuit and the discharge circuit discharges the static electricity to the discharge terminal;
    wherein the driving sub-circuit comprises an edge trigger and a reverse device; a C terminal of the edge trigger is connected with the detection sub-circuit, a D terminal of the edge trigger is connected with the discharge circuit, a Q terminal of the edge trigger is connected with an input terminal of the reverse device, and an output terminal of the reverse device is connected with the discharge circuit.

2. The display panel static electricity protection device according to claim 1, wherein the detection sub-circuit comprises a reverse diode; a cathode of the reverse diode is connected with the driving chip, and an anode of the reverse diode is connected with the driving sub-circuit.

3. The display panel static electricity protection device according to claim 2, wherein a breakdown voltage value of the reverse diode is greater than a maximum operating voltage of the driving chip.

4. The display panel static electricity protection device according to claim 2, wherein the detection sub-circuit comprises a first resistor, the first resistor is connected with the driving sub-circuit; one end of the first resistor is connected with the anode of the reverse diode, another end of the first resistor is connected with a grounding wire.

5. The display panel static electricity protection device according to claim 4, wherein a resistance value of the first resistor is greater than or equal to 100 kΩ.

6. The display panel static electricity protection device according to claim 1, wherein the discharge circuit comprises a semiconductor field effect transistor; an input terminal of the semiconductor field effect transistor is connected with the driving chip, a control terminal of the semiconductor field effect transistor is connected with the detection circuit, and an output terminal of the semiconductor field effect transistor is connected with a grounding wire.

7. The display panel static electricity protection device according to claim 6, wherein the semiconductor field effect transistor is an N-type transistor.

8. The display panel static electricity protection device according to claim 1, wherein the driving chip comprises a timing controller chip.

9. The display panel static electricity protection device according to claim 1, wherein the driving chip comprises a power chip.

10. The display panel static electricity protection device according to claim 1, wherein the driving sub-circuit comprises a second resistor; one end of the second resistor is connected with the output terminal of the reverse device, another end of the second resistor is connected with a grounding wire.

11. A display panel static electricity protection method, comprising a display panel comprising:
- a detection circuit connected with a driving chip of a display panel;
- a discharge circuit connected with the detection circuit and the driving chip; and
- a discharge terminal connected with the discharge circuit and the detection circuit;
- wherein after the detection circuit detects static electricity, the detection circuit opens the discharge circuit, and the static electricity is discharged to the discharge terminal through the discharge circuit;
- wherein the detection circuit comprises a detection sub-circuit and a driving sub-circuit; the detection sub-circuit is connected with the driving sub-circuit; when the static electricity passes through the detection sub-circuit, the driving sub-circuit opens the discharge circuit and the discharge circuit discharges the static electricity to the discharge terminal;
- wherein the driving sub-circuit comprises an edge trigger and a reverse device; a C terminal of the edge trigger is connected with the detection sub-circuit, a D terminal of the edge trigger is connected with the discharge circuit, a Q terminal of the edge trigger is connected with an input terminal of the reverse device, and an output terminal of the reverse device is connected with the discharge circuit;
- wherein the display panel static electricity protection method comprises:
- detecting whether the driving chip has static electricity by the detection circuit;
- opening the discharge circuit if the driving chip has the static electricity; and
- closing the discharge circuit if the driving chip has no static electricity.

12. A display device, comprising a display panel, a driving circuit board, and a static electricity protection device comprising:
- a detection circuit connected with a driving chip of a display panel;
- a discharge circuit connected with the detection circuit and the driving chip; and
- a discharge terminal connected with the discharge circuit and the detection circuit;
- wherein after the detection circuit detects static electricity, the detection circuit opens the discharge circuit, and the static electricity is discharged to the discharge terminal through the discharge circuit; the driving circuit board is connected with the display panel; the static electricity protection device is disposed on the driving circuit board;
- wherein the detection circuit comprises a detection sub-circuit and a driving sub-circuit; the detection sub-circuit is connected with the driving sub-circuit; when the static electricity passes through the detection sub-circuit, the driving sub-circuit opens the discharge circuit and the discharge circuit discharges the static electricity to the discharge terminal;
- wherein the driving sub-circuit comprises an edge trigger and a reverse device; a C terminal of the edge trigger is connected with the detection sub-circuit, a D terminal of the edge trigger is connected with the discharge circuit, a Q terminal of the edge trigger is connected with an input terminal of the reverse device, and an output terminal of the reverse device is connected with the discharge circuit.

13. The display device according to claim 12, wherein the detection sub-circuit comprises a reverse diode; a cathode of the reverse diode is connected with the driving chip, and an anode of the reverse diode is connected with the driving sub-circuit.

* * * * *